(12) United States Patent
Boecking

(10) Patent No.: US 6,633,108 B1
(45) Date of Patent: Oct. 14, 2003

(54) PIEZO-ACTUATOR COMPRISING A TEMPERATURE COMPENSATOR

(75) Inventor: Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/018,649
(22) PCT Filed: Jun. 6, 2000
(86) PCT No.: PCT/DE00/01838
§ 371 (c)(1),
(2), (4) Date: Mar. 25, 2002
(87) PCT Pub. No.: WO00/79614
PCT Pub. Date: Dec. 28, 2000

(30) Foreign Application Priority Data

Jun. 19, 1999 (DE) .......................... 199 28 183

(51) Int. Cl.[7] ............................................... H01L 41/08
(52) U.S. Cl. ...................................................... 310/346
(58) Field of Search .......................................... 310/346

(56) References Cited

U.S. PATENT DOCUMENTS

| | | | | |
|---|---|---|---|---|
| 4,284,263 A | * | 8/1981 | Newcomb | .................. 137/468 |
| 4,550,744 A | | 11/1985 | Igashira | ....................... 137/80 |
| 6,313,568 B1 | * | 11/2001 | Sullivan et al. | ............. 310/346 |
| 6,452,308 B1 | * | 9/2002 | Heinz et al. | ................. 310/328 |

FOREIGN PATENT DOCUMENTS

| | | | |
|---|---|---|---|
| DE | 30 37 078 A | 4/1982 | ............. F01L/9/00 |
| DE | 196 50 900 A | 6/1998 | .......... F02M/51/06 |
| DE | 198 49 203 A | 4/2000 | ........... H02N/11/00 |

* cited by examiner

Primary Examiner—Thomas M. Dougherty
(74) Attorney, Agent, or Firm—Michael J. Striker

(57) ABSTRACT

A piezoelectric actuator, e.g., for actuating a mechanical component, is proposed, in which a piezoelectric element (2) for acting on an actuating element (9) with a pulling or pushing force, and a compensating element (3; 20) are provided, wherein the piezoelectric element (2) and the compensating element (3; 20) basically have the same temperature expansion coefficients. The compensating element (3; 20) is mechanically coupled to the piezoelectric element (2) in such a fashion that the temperature-induced expansions of the piezoelectric element (2) and the compensating element (3; 20) cancel each other out in the effective direction in such a fashion that the actuating element (9) remains in its position. A heat transfer compound (12) is located between the piezoelectric element (2; 21) and the compensating element (3; 22).

8 Claims, 1 Drawing Sheet

PIEZO-ACTUATOR COMPRISING A TEMPERATURE COMPENSATOR

PRIOR ART

Figure 1:
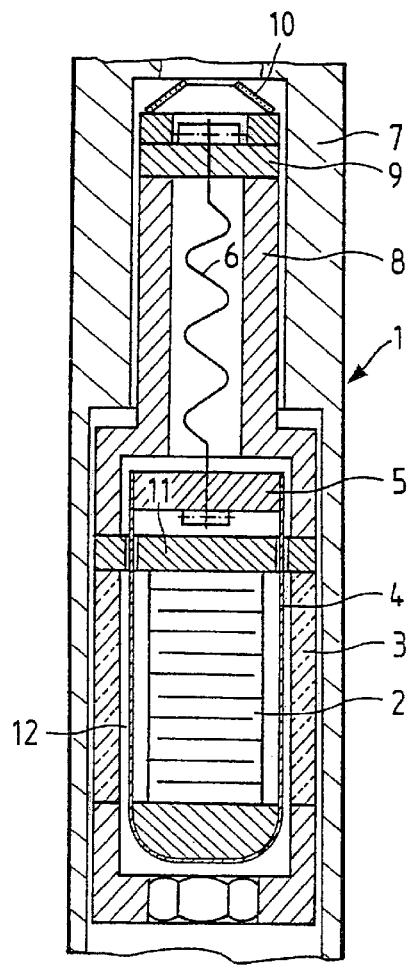

The invention provides a piezoelectric actuator, e.g., for actuating a mechanical component such as a valve or the like, according to the generic features of the primary claim.

It is generally known that, by utilizing the "piezoelectric effect", a piezoelectric element can be built using a material having a suitable crystal structure. When an external electrical voltage is applied, a mechanical reaction of the piezoelectric element takes place that represents a push or a pull in a specifiable direction depending on the crystal structure and the application site of the electrical voltage.

The piezoelectric actuators named previously are often used to position valves. In this case it should be noted, among other things, that their lifting ability for actuating a valve tappet, for example, is relatively small. On the other hand, the different thermal expansion of the ceramic of the piezoelectric element and the housing leads to problems; the piezoelectric element has a very low temperature expansion and the housing, which is usually metallic, has a positive temperature expansion, which can lead to a drifting of the position of the valve tappet without control by the piezoelectric element.

So far, such perturbing actions could only be diminished in the usual fashion by using very expensive materials, such as invar, which have a negative temperature expansion. Another method was to connect a material with high temperature expansion in series with the piezoelectric element, which, however, reduces the stiffness of the system and, therefore, the acutator force.

ADVANTAGES OF THE INVENTION

The piezoelectric actuator already explained hereinabove, which can be used to actuate a mechanical component, for example, advantageously comprises a piezoelectric element with which, according to the invention, a compensating element is arranged in parallel. It is particularly advantageous thereby that the piezoelectric element and the compensating element basically have the same temperature expansion coefficients, so that the temperature-induced expansions of the piezoelectric element and the compensating element—when the two elements are mechanically installed in suitable fashion—cancel each other out in the effective direction in such a fashion that an actuating element solidly connected to a pressing plate of the piezoelectric element remains in its position. It can therefore be achieved in simple fashion that a metallic housing, e.g., made of steel, is still used for the piezoelectric actuator, and the piezoelectric element can be fastened in the housing in such a fashion that the compensating element for temperature compensation is always solidly connected to the piezoelectric element. In an especially preferred exemplary embodiment of the invention, a heat transfer compound is located between the piezoelectric element and the compensating element, with which a good temperature compensation between the compensating element and the piezoelectric element can be produced.

According to the invention and in advantageous fashion, the piezoelectric element can be pretensioned in itself in simple fashion. The piezoelectric element is supported on one end against a fixed support plate that bears against a housing for the piezoelectric actuator via a spring. At the other end, the piezoelectric element is connected via a pressing plate to a pretensioning spring which, in turn, is held with its other end against the fixed support plate. The compensating element thereby lies basically parallel to the piezoelectric element and also bears against the fixed support plate at one end; at the other end, the compensating element solidly abuts the housing. The pretensioning spring and the piezoelectric element can thereby be arranged in simple fashion in tandem, for example, whereby the movable end of the piezoelectric element can be connected to the pressing plate via a tightening strap. It is also possible, however, that the pretensioning spring and the piezoelectric element are situated parallel to each other, whereby, for instance, two symmetrically located zigzag springs can be located in the heat transfer compound as pretensioning springs that are also parallel to each other.

The proposed interconnection of the piezoelectric element, the ceramic ring, and the pretensioning spring is solidly braced with the housing, whereby the pretensioning forces are much higher than the switching forces of the piezoelectric element, and the pretensioning spring makes a temperature compensation motion relative to the housing possible. The magnitude of the pretension can thereby be produced in simple fashion via a mounting nut. Even when the temperature expansion coefficient of the compensating element does not correspond to that of the piezoelectric element, the temperature compensation can be "tuned" via the length of the compensating element. In the exemplary embodiment, the support of the compensating element on the mounting nut represents the common zero point, which mounting nut is solidly connected to the housing.

This and further features of preferred further developments of the invention arise out of the claims as well as the description and the drawings, whereby the individual features can be realized alone or in plurality in the form of subcombinations in the exemplary embodiment of the invention and in other fields, and they can represent advantageous and inherently patentable embodiments, for which protection is claimed here:

DRAWING

Exemplary embodiments of the temperature-compensated piezoelectric actuator according to the invention, e.g., for the positioning of a valve, are explained using the drawing.

Figure 2:
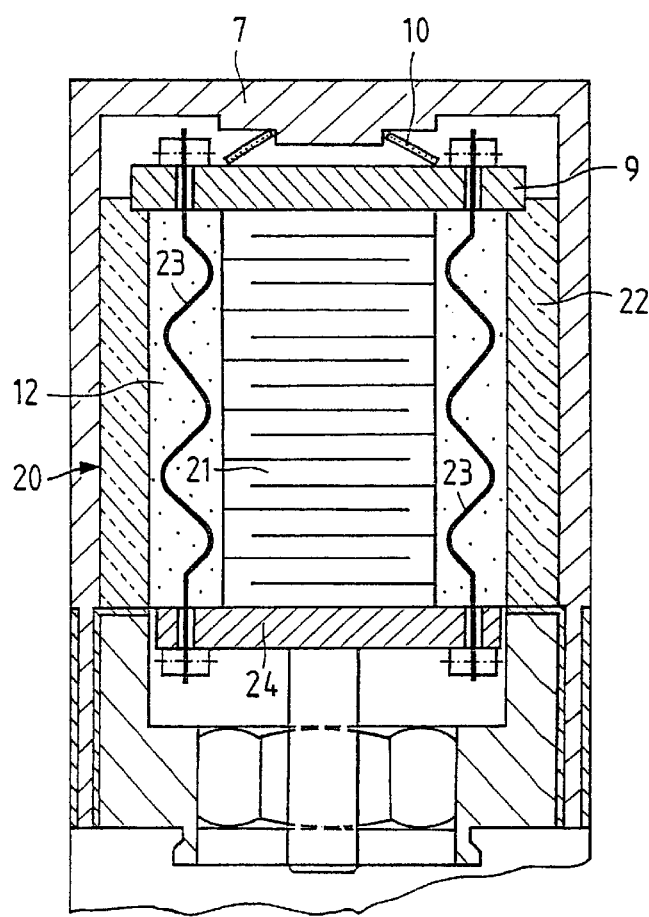

FIG. 1 is a sectional view through a piezoelectric actuator held with a tightening strap with a compensating element and a pretensioning spring located behind it, and FIG. 2 is a sectional view through a piezoelectric actuator with a compensating element and pretensioning springs located parallel to each other.

DESCRIPTION OF THE EXEMPLARY EMBODIMENTS

FIG. 1 shows a piezoelectric actuator that comprises a piezoelectric element 2 that is built in known fashion out of piezoelectric plies of a quartz material having a suitable crystal structure, so that, by utilizing the "piezoelectric effect", when an external electrical voltage is applied to electrodes not shown in this figure, a mechanical reaction of the piezoelectric actuator 1 takes place. In the piezoelectric actuator 1 according to FIG. 1, the piezoelectric element 2 is made of ceramic and a compensating element 3 is also made of ceramic, but without a "piezoelectric effect".

The piezoelectric element 2 is surrounded by a tightening strap 4 that is welded to a pressing plate 5 at the top, which serves as the mount for a zigzag spring 6 as the tensioning spring. A base plate 11, with which the piezoelectric element 2 abuts, lies between the compensating element 3 which solidly bears against the housing 7 or a mounting nut on the other side, and a sleeve arrangement 8, which, in turn, bears against a fixed support plate 9. The fixed support plate 9, in turn, is held against the housing 7 via a spring 10 for the compensating element 3. The pretensioning spring 6 is thereby held between the pressing plate 5 and the fixed support plate 9. In the exemplary embodiment, an actuation of the piezoelectric actuator 1 leads to an axial expansion of the piezoelectric element 2 and, therefore, to an axial motion of an actuating element not visible here.

A heat transfer compound 12 is applied between the piezoelectric element 2 and the compensating element 3, which makes an optimal temperature compensation of these two elements possible. Since the piezoelectric element 2 and the compensating element 3 basically have the same temperature expansion coefficients, the temperature-induced expansions of the piezoelectric element 2 and the compensating element 3 lead to a cancellation of the influences of both elements 2 and 3 in the effective direction with the proposed mechanical installation. The actuating element can therefore remain in its position.

A second exemplary embodiment of a piezoelectric actuator 20 is shown in FIG. 2, whereby the equally-acting components are labelled with the same reference numerals as in FIG. 1. In the arrangement according to FIG. 2 as well, a piezoelectric element 21 and a compensating element 22 are produced out of a ceramic materal with nearly identical temperature expansion coefficients. Zigzag springs 23, as pretensioning springs, arranged in parallel, and a heat transfer compound 12 are located here between the elements 21 and 22. In this exemplary embodiment as well, an actuation of the piezoelectric actuator 20 leads to an axial expansion of the piezoelectric element 21 and, therefore, to an axial motion of an actuating element—guided by a pressing plate 24 and not shown here—against the pretension of the pretensioning springs 23.

Since, in this case as well, the piezoelectric element 21 and the compensating element 22 basically have the same temperature expansion coefficients, the temperature-induced expansions of the piezoelectric element 21 and the compensating element 22 lead to a cancellation of the influences of the two elements 21 and 22 in the effective direction with the proposed mechanical installation. The actuating element solidly connected to the pressing plate 24 of the piezoelectric element 21 can therefore remain in its position.

What is claimed is:

1. Piezoelectric actuator having a piezoelectric element (2; 21) for actuating a mechanical component with a pulling or pushing force, and a compensating element (3: 22), wherein the piezoelectric element (2) and the compensating element (3; 22) basically have the same temperature expansion coefficients, and wherein the compensating element (3; 22) is mechanically coupled to the piezoelectric element (2; 21) in such a fashion that the temperature-induced expansions of the piezoelectric element (2; 21) and the compensating element (3; 22) cancel each other out in the effective direction in such a fashion that the actuating element remains in the position, and wherein a heat transfer compound (12) is located between the piezoelectric element (2; 21) and the compensating element (3; 22).

2. Piezoelectric actuator according to claim 1, characterized in that the piezoelectric element (2; 21) is composed of a multilayer structure of the transversely arranged, ceramic piezoelectric plies that become longer in the effective direction when an external electric voltage is applied, and the compensating element (3; 22) is made of ceramic.

3. Piezoelectric actuator having a piezoelectric element (2; 21) for actuating a mechanical component with a pulling or pushing force, and a compensating element (3; 22), wherein the piezoelectric element (2) and the compensating element (3; 22) basically have the same temperature expansion coefficients, and wherein the compensating element (3; 22) is mechanically coupled to the piezoelectric element (2: 21) in such a fashion that the temperature-induced expansions of the piezoelectric element (2; 21) and the compensating element (3; 22) cancel each other out in the effective direction in such a fashion that the actuating element remains in the position, and wherein the piezoelectric element (2; 21) is supported on one end on a fixed support plate (9), which fixed support plate (9) bear against the housing (7) for the piezoelectric actuator (1; 20) via a spring (10) and which is connected at the other end to a pretensioning spring (6; 23), in turn, is held against the fixed support plate (9) with its other end, and that the compensating element (3; 22) basically ties parallel to the piezoelectric element (2; 21) and is also held against the fixed support plate (9) with one end and solidly abuts the housing (7) with the other end.

4. Piezoelectric actuator to claim 3, characterized in that the pretensioning spring (6) and the piezoelectric element (2) are located in tandem.

5. Piezoelectric actuator according to claim 4, characterized in that the movable end of the piezoelectric element (2) is connected to the pressing plate (5) via a tightening strap (8).

6. Piezoelectric actuator according to claim 3, characterized in that the pretensioning spring (23) and the piezoelectric element (21) are situated parallel to each other.

7. Piezoelectric actuator according to claim 3, characterized in that the pretensioning spring is formed out of at least one zigzag spring (6; 23).

8. Piezoelectric actuator having a piezoelectric element (2; 21) for actuating a mechanical component with a pulling or pushing force, and a compensating element (3; 22) wherein the piezoelectric element (2) and the compensating element (3; 22) basically have the same temperature expansion coefficients, and wherein the compensating element (3; 22) is mechanically coupled to the piezoelectric element (2; 21) in such a fashion that the temperature-induced expansions of the piezoelectric element (2; 21) and the compensating element (3; 22) cancel each other out in the effective direction in such a fashion that the actuating element remains in the position, and wherein the piezoelectric element (2, 21) is composed of a multilayer structure of transversely arranged, ceramic piezoelectric plies that become longer in the effective direction when an external electric voltage is applied, and that the compensating element (3; 22) is composed of piezoelectric plies arranged in the longitudinal direction that become shorter in the effective direction when an external electric voltage is applied.

* * * * *